United States Patent
Mauder et al.

(10) Patent No.: US 8,716,792 B2
(45) Date of Patent: May 6, 2014

(54) SEMICONDUCTOR DEVICE WITH A CHARGE CARRIER COMPENSATION STRUCTURE AND METHOD FOR THE PRODUCTION OF A SEMICONDUCTOR DEVICE

(75) Inventors: Anton Mauder, Kolbermoor (DE); Franz Hirler, Isen (DE); Armin Willmeroth, Augsburg (DE); Michael Rueb, Faak am See (AT); Holger Kapels, Holzkirchen (DE)

(73) Assignee: Infineon Technologies Austria AG, Villach (AT)

( * ) Notice: Subject to any disclaimer, the term of this patent is extended or adjusted under 35 U.S.C. 154(b) by 957 days.

(21) Appl. No.: 12/241,985

(22) Filed: Sep. 30, 2008

(65) Prior Publication Data

US 2010/0078775 A1    Apr. 1, 2010

(51) Int. Cl.
    *H01L 21/20* (2006.01)
(52) U.S. Cl.
    USPC ........... 257/341; 257/328; 257/329; 257/339; 257/E29.008
(58) Field of Classification Search
    USPC ........................................................ 257/328
    See application file for complete search history.

(56) References Cited

U.S. PATENT DOCUMENTS

| 6,274,904 | B1* | 8/2001 | Tihanyi | 257/329 |
| 7,161,209 | B2 | 1/2007 | Saito et al. | |
| 2003/0230767 | A1* | 12/2003 | Tihanyi | 257/200 |
| 2005/0045922 | A1* | 3/2005 | Ahlers et al. | 257/242 |
| 2005/0280086 | A1* | 12/2005 | Saito et al. | 257/341 |
| 2006/0197159 | A1* | 9/2006 | Schmidt | 257/354 |
| 2008/0087952 | A1* | 4/2008 | Pfirsch | 257/334 |

FOREIGN PATENT DOCUMENTS

| DE | 103 24 100 | 12/2004 |
| JP | 2003-115589 | 4/2003 |

* cited by examiner

*Primary Examiner* — Colleen Matthews
*Assistant Examiner* — William Harriston
(74) *Attorney, Agent, or Firm* — Dicke, Billig & Czaja, PLLC (57) ABSTRACT

A semiconductor device has a cell field with drift zones of a first type of conductivity and charge carrier compensation zones of a second type of conductivity complementary to the first type. An edge region which surrounds the cell field has a higher blocking strength than the cell field, the edge region having a near-surface area which is undoped to more weakly doped than the drift zones, and beneath the near-surface area at least one buried, vertically extending complementarily doped zone is positioned.

10 Claims, 9 Drawing Sheets

SEMICONDUCTOR DEVICE WITH A CHARGE CARRIER COMPENSATION STRUCTURE AND METHOD FOR THE PRODUCTION OF A SEMICONDUCTOR DEVICE

BACKGROUND

A semiconductor device may have a cell field with drift zones of a first type of conductivity and charge carrier compensation zones of a second type of conductivity complementary to the first. The cell field is surrounded by an edge region which has a higher blocking strength than the cell field.

In attempting to achieve high avalanche strength in semiconductor devices of this type with charge carrier compensation structures, the fact that the blocking strength of the edge region is greater than that of the cell field means that breakdown takes place in the cell field first and that it is possible, since the area of the cell field through which the current passes is greater than the area of the edge region, to run a higher current in the semiconductor device without damaging the semiconductor device. When a switch with a semiconductor device of this type breaks down, the load current continues via charge carrier pairs generated by avalanche multiplication. These charge carriers flow at saturation drift speed through the blocking depletion layer in the active region of the semiconductor and consequently lead to a change in electrical field distribution.

In semiconductor devices with column-shaped charge carrier compensation zones the charge carriers generated by avalanche multiplication are separated by the transverse electrical field of the columns, and the holes flow through the p-columns towards source while the electrons in the n-region flow towards drain. However, the aforementioned change in electrical field distribution creates high field zones in the semiconductor chip which, when current densities are sufficiently high, lead to excessive carrier generation and finally cause a breakdown of the blocking voltage at the semiconductor device. This permits the generation of oscillations which may lead to the destruction of the device.

To achieve higher blocking strength in the edge region, it is possible to provide in the edge region a charge carrier compensation structure in which the charge carrier compensation zones in the edge region are positioned in a smaller grid than in the cell field, for example in a half cell field grid. This guarantees, in combination with a suitable dopant concentration of the drift zones and the charge carrier compensation zones, a higher blocking strength at the edge than in the cell field. The semiconductor devices described above may for example be produced by a layered building-up of a plurality of epitactically grown semiconductor layers, wherein in at least some of the semiconductor layers the doping of the drift zones and/or the charge carrier compensation zones is inserted via openings in masks, for example by ion implantation. However, when the grid pitch of the charge carrier compensation zones and accordingly the openings of the masks are reduced, fluctuations in the accuracy of the compensation doping occur—due to fluctuations in the dimensions of the photoresist of the implantation masks in the edge region, for example—thereby limiting the dopant level.

Moreover, it is possible in the region of the active cell field to provide charge carrier compensation columns and drift zone columns with variable doping in which, when reverse-biased, it is possible to generate specific electrical field peaks at which avalanche-generated charge carriers flow first through regions with lower field strength, so that the change of the electric field does not lead to an immediate avalanche-generation of secondary charge carriers thereby preventing oscillations and/or the breakdown of the blocking voltage described above. Not until relatively high current densities are achieved do these regions contribute to the further generation of charge carriers. However, the blockability of the device has to be partly sacrificed due to the variable doping of the columns, whereby the electrical field as a result has a correspondingly greater ripple. This means that when these methods are used to increase avalanche strength neither blockability nor on-state resistance may be utilised optimally.

For these and other reasons, there is a need for the present invention.

SUMMARY

In one embodiment, a semiconductor device includes a semiconductor body which has charge carrier compensation structures. The semiconductor device has a cell field with drift zones of the first type of conductivity and charge carrier compensation zones of a second type of conductivity complementary to the first type. An edge region surrounds the cell field, the edge region having a near-surface area of the first type of conductivity which is undoped to more weakly doped than the drift zones, and beneath the near-surface area at least one buried, vertically extending zone with the second type of conductivity is positioned.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
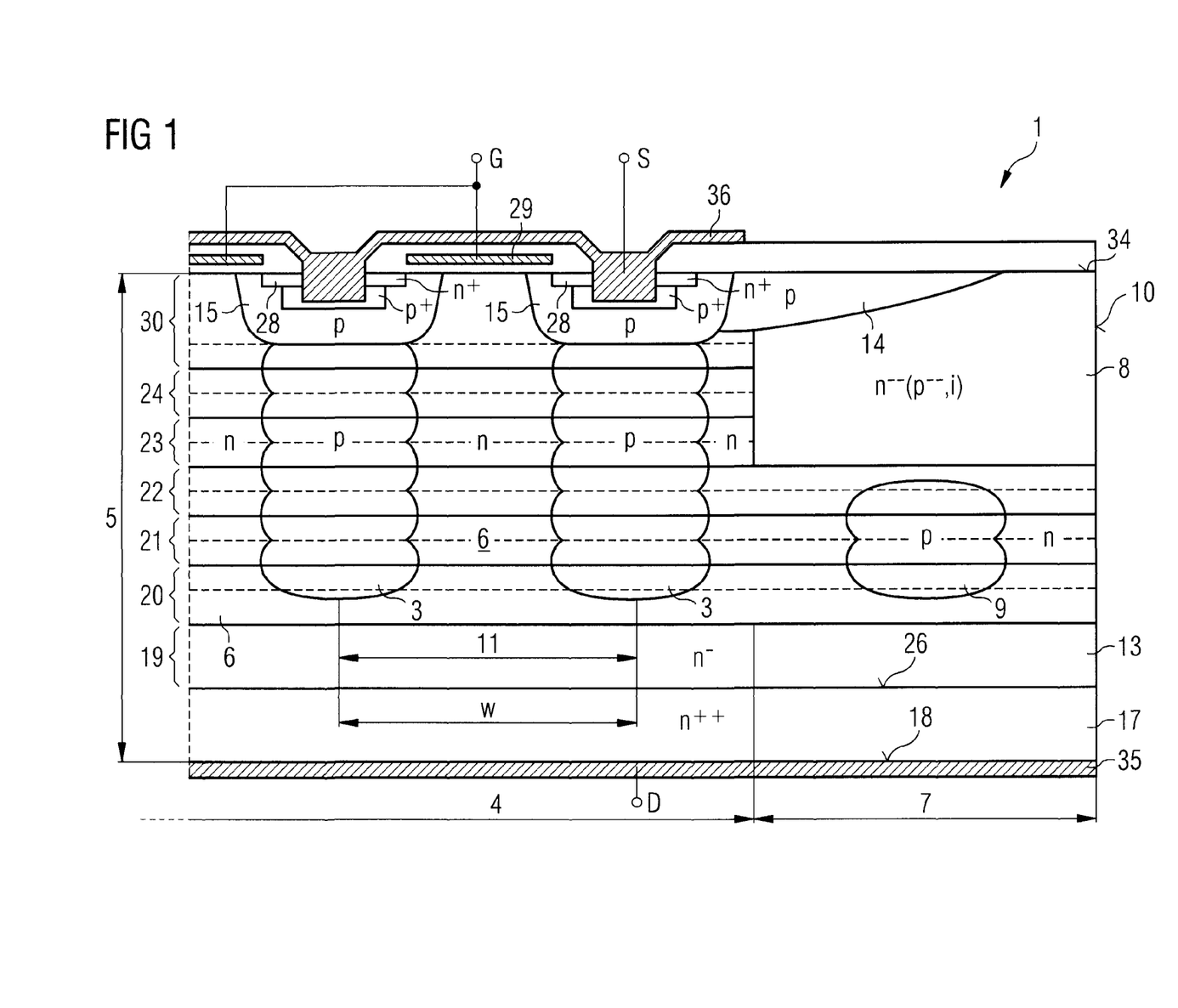
FIG. 1 illustrates a schematic cross-section through a semiconductor device.

FIG. 1 illustrates a schematic cross-section through a part of a semiconductor device 1. This part illustrates the transition from an edge region 7 which extends from a semiconductor chip edge 10 to a cell field 4 which is surrounded by the edge region 7. Of the cell field 4 with charge carrier compensation structure, only two charge carrier compensation zones 3 with drift zones 6 positioned between them in a cell field grid pitch 11 are illustrated. These charge carrier compensation zones 3 are produced using a multi-epitaxy technique.

FIG. 1 illustrates a MOS field-effect transistor with a lateral gate structure 29. In a non-illustrated embodiment, other semiconductor devices with charge compensation structures such as, for example, MOS field-effect transistors with trench gate structures, IGBT (Insulated Gate Bipolar Transistor) structures and/or power diodes with charge carrier compensation structures are provided.

The same charge carrier compensation zones are provided in the edge region 7 using a multi-epitaxy technique. However, in order to ensure that the blocking strength is greater in the edge region 7 than in the cell field 4, it is possible to provide a smaller grid pitch for the column-shaped charge carrier compensation zones in the edge region 7.

As described above, such reductions in grid pitch for the charge carrier compensation zones in the edge region 7 have their limits. These limits are overcome in the embodiment illustrated in FIG. 1 and, as illustrated in FIG. 1, it is therefore almost possible to maintain the cell field grid pitch 11 in the edge region 7. The charge carrier compensation zones 3 in the edge region 7 are buried zones 9 in the lower epitaxy layers 20, 21 and possibly 22 and do not continue into the upper epitaxy layers 23, 24 and 30. In fact, the upper epitaxy layers 23, 24 and 30 have an edge region 7 which either remains entirely undoped during epitaxy growth and thus has a minimal intrinsic charge carrier concentration or is at least more weakly doped than the drift zones 6 positioned between the charge carrier compensation zones 3 in the cell region. In this context, undoped or minimal intrinsic charge carrier concentration may also mean that no intended dopant concentration is generated during the epitactic growth, but rather that a donor and/or acceptor dopant concentration is generated by the state of the epitaxy facilities, the used process gases and/or the semiconductor wafer. The actual charge carrier concentration thus may be up to some orders of magnitude higher than the intrinsic charge carrier concentration of the semiconductor material.

The semiconductor device illustrated in FIG. 1 provides different compensation methods over the depth of the semiconductor body 5 in order to optimise the blockability, avalanche strength and on-state DC resistance of the two components of the semiconductor device 1, that is the edge 7 and the cell field 4. A low to undoped area 8 is provided as homogenous as possible in the upper part of the edge region 7 such that, when reverse-biased, no further electrical field peaks occur in the edge region which might lead to early breakdowns and thus to premature avalanche breakdown in the edge region. Further away from the semiconductor surface and thus buried in the semiconductor body 5, dopant distribution is less critical and here it is therefore possible to maintain the standard structure of the charge carrier compensation zones 3 in the cell field 4.

The upper part, i.e., the part positioned for example above a maximum field strength occurring approximately in a middle epitaxy layer 22 when a compensation device is produced using surface mount technology or multi-epitaxy technology, has undoped epitaxy layers or partially doped epitaxy layers 23, 24 and 30 in the active cell field 4 and in the edge region 7. In the active cell field 4 the n-doping for the drift zones 6 may be carried out predominantly by masked implantation, omitting the edge region 4. The p-doping is also masked in the upper part in the edge region 7 such that no charge carrier compensation zones are formed in the upper epitaxy layers 23, 24 and 30.

In the lower region of the edge region 7 the ripple of the electrical field strength which arises due to the multi-epitaxy technique used is less critical and it is therefore possible to insert both n- and p-doping into the lower epitaxy layers 20 and 21 in the edge region 7. In this case it is irrelevant that the p-charge carrier compensation zones or p-walls in the lower part of the edge region 7 are buried and thus rather than being connected to the source potential are in fact floating in the edge region 7. As a result, when the semiconductor device is switched on, the buried zones 9 discharge only via thermally generated charge carriers since there is no significant current flow in the edge region 7, and as a result the depletion regions around the floating buried p-zones 9 do not play a crucial role.

The blockability of such floating p-charge carrier compensation areas 9 is given in just the same manner as that of the charge carrier compensation zones 3 connected to source. In the semiconductor device 1 illustrated in FIG. 1, an edge structure with variable lateral dopant concentration 14 (VLD structure) of complementary second type of conductivity is provided near the surface of the edge region 7. With VLD structures 14 of this type particularly high blockability may be achieved in the edge region 7, in particular when provided in the low to undoped area 8.

The dopant dose of the VLD structures, that is the integral dopant concentration in vertical direction, integrated from the surface of the VLD structure to the pn-junction located at the bottom of the VLD structure, varies in lateral direction and decreases towards the semiconductor chip edge.

When the VLD structure laterally adjoins highly doped regions, like for example body zones, the dopant dose of the VLD structure at the interface to the highly doped regions is typically in the range of the breakthrough charge, which in silicon is about $1.3 \cdot 10^{12}$ cm$^{-2}$ to $3 \cdot 10^{12}$ cm$^{-2}$, or higher. Towards the semiconductor chip edge, the dopant dose of the VLD structure decreases and, at the edge-sided end of the VLD structure, is significantly smaller than the breakthrough charge.

In the illustrated embodiment, the lateral decrease of the dopant dose of the VLD structure is provided by a p-doped region, which towards the semiconductor chip edge vertically extends continuously less in the semiconductor body 5. In some embodiments, the depth of the VLD structure is substantially constant and the lateral decrease of the dopant dose of the VLD structure is provided by a decreasing dopant concentration in lateral direction, for instance when the penetration depth is substantially constant.

In the illustrated embodiment, the lateral decrease of the dopant dose of the VLD structure is continuously graded. In other embodiments, the lateral decrease of the dopant dose of the VLD structure may be step-like, linear or according to a calculated distribution or may be a combination of the aforementioned options.

By providing the VLD structure, the depletion region may extend up to the front-sided surface 34 of the semiconductor body 5 in the direction of the semiconductor chip edge for decreasing values of the blocking voltage. Thereby, when reverse-biased, peaks in the electric field distribution may be avoided and a high blockability of the semiconductor device may be achieved.

The VLD structure may be produced for example by providing a masking layer on the front-sided surface 34 of the semiconductor body 5, extending from the outermost body zone of the cell region towards the semiconductor chip edge, wherein the masking layer includes openings, which become continuously more narrow towards the semiconductor chip edge and inserting dopant depots via the masking layer by for example ion implantation. The process of the insertion of dopant depots may contain a plurality of masking processes and implantation processes. In a further process, the inserted dopant depots are diffused together. If the resolution of the masking technique is sufficiently high, at least one implantation process may be provided by the implantation of the body zones.

The semiconductor device 1 illustrated in FIG. 1 is mounted on a substrate 17 which has a high dopant concentration of an n$^{++}$-conducting, first type of conductivity compared with the drift zones 6 produced by epitaxy. The lower side 18 of this substrate 17 has a metallization 35 for the connection 10 of a drain D of the semiconductor device 1. Positioned on the upper side 26 of the substrate 17 is an epitaxy layer 19 with a dopant concentration which is typically lower than the dopant concentration of the subsequent epitaxy layers of the drift zones 6 and the dopant concentration of the substrate 17. The epitaxy layer 19 thus forms a lateral buried field stop zone 13 with an n$^-$-conducting first type of conductivity.

Provided in the next two epitaxy layers 20 and 21 in both the cell region 4 and the edge region 7 are corresponding charge carrier compensation zones of a second type of conductivity complementary to the first type which in this embodiment have approximately the same grid pitch 11. These buried zones 9 of the second type of conductivity may also be positioned in a smaller grid pitch. Since a maximum field strength with connected semiconductor device occurs in the active cell field 4 with the central epitaxy layer 22, the compensation structure of the cell region differs from the structure of the edge region 7 from this point on.

Epitaxy layers 23, 24 and 30 which are weakly doped to undoped and which are subsequently doped with appropriate dopants in the cell region 7 to form charge carrier compensation structures are now applied for the edge region 7 and the cell field 4 while during these processes, i.e., during the implantation of p- and n-dopants in the cell region 4, the edge region 7 is covered and protected against further doping, thereby forming the undoped or weakly doped area 8 illustrated in FIG. 1.

It is then possible to insert the connection structures such as body zones 15 with complementary type of conductivity or in some cases as illustrated here with two stages of dopant concentration, namely p-conducting and p$^+$-conducting, and the corresponding n$^+$-conducting source zones 28 of the first type of conductivity in high concentrations into the uppermost epitaxy layer 30. When inserting the body zones it is possible to simultaneously produce the aforementioned VLD structure 14 which has a higher concentration towards the body zone and thus towards the cell field 4, which then gradually and/or step-like decreases in the edge region 7 towards the semiconductor chip edge 10.

By the appropriate alternation of structured oxide layers or insulating layers with structured electrically conductive layers such as polysilicon layers and metal layers it is possible to structure the front-sided surface 34 of the semiconductor body 5 with a lateral gate structure 29 and a source metallization 36.

In some embodiments, the low to undoped area 8 includes more or less epitaxy layers than the layers 23, 24 and 30, illustrated in FIG. 1. Moreover, the semiconductor device may include more or less layers in total than the illustrated layers 20 to 24 and 30. In particular, the semiconductor device may be provided without a lateral buried field stop zone.

Figure 2:
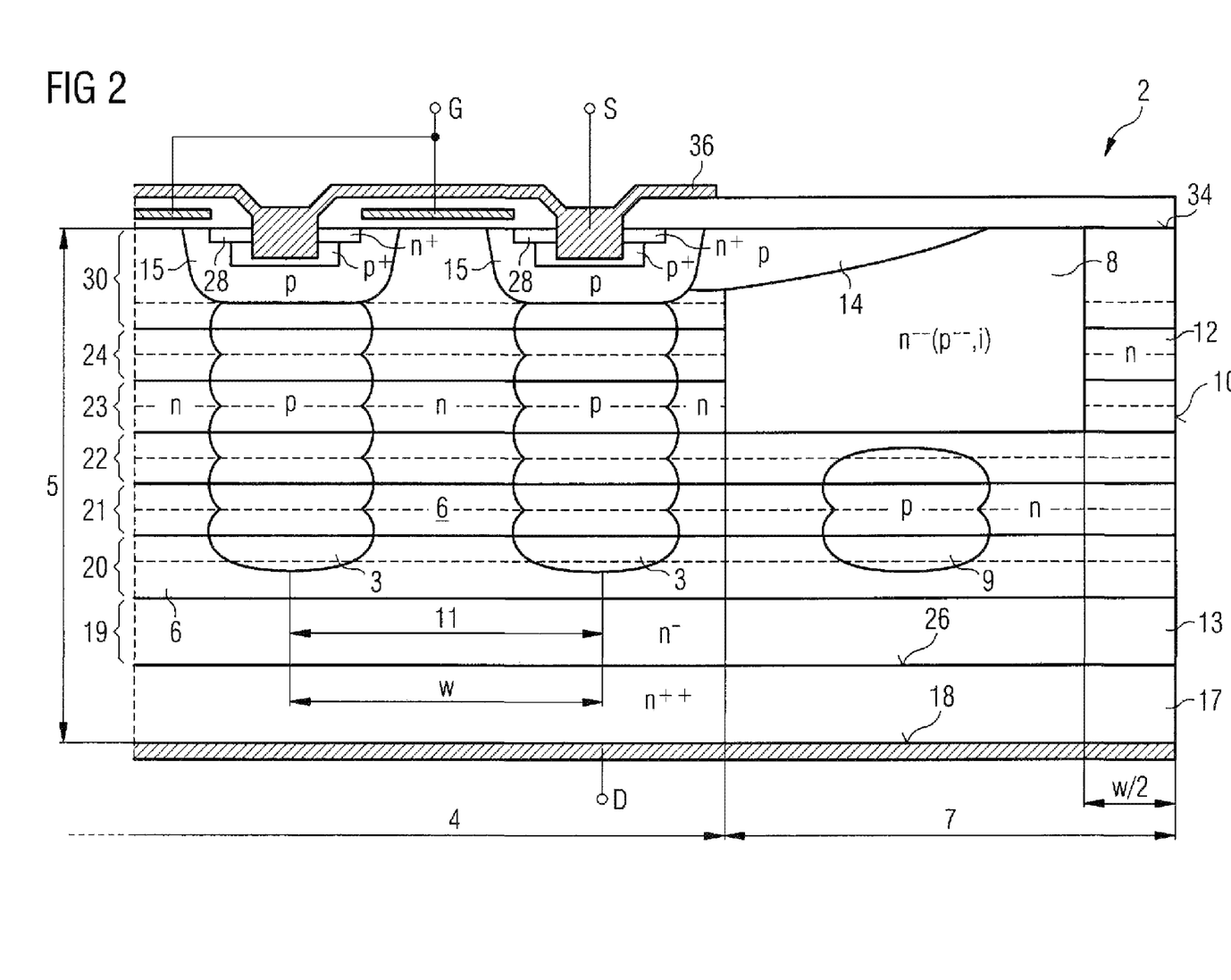
FIG. 2 illustrates a schematic cross-section through a semiconductor device.

FIG. 2 illustrates a schematic cross-section through a semiconductor device 2. Components with the same functions as those described in relation to FIG. 1 are designated by the same reference numbers and are not discussed in any greater detail here. The difference to the semiconductor device illustrated in FIG. 1 lies in the fact that the semiconductor device 2 has not only a buried field stop zone 13, but also a lateral field stop zone 12 running upwards to the front-sided surface 34 of the semiconductor body 5 in the edge region 7 along the semiconductor chip edge 10.

In this arrangement, the doping of this field stop zone 12 corresponds to the doping of the drift zones 6 in the cell field 4 in that a specifically adapted mask is provided for the edge region 7 during the implantations after the epitaxy layers 23, 24 and 30. As illustrated in FIG. 2, the width of this field stop zone 12 may be at least half of the grid pitch w of the cell field 4, but may also become significantly higher, in particular in view of the positioning tolerance of the sawing track when separating the chips. The production of a lateral field stop zone 12 of this type may limit the lateral range of the electrical field near the surface towards the semiconductor chip frame of a semiconductor wafer, and may be achieved in a simple manner if the mask for the n-implantation covers the edge region 7 for the undoped or weakly doped area 8 only and remains uncovered for the field stop zone region. As a result, as described above, it is possible to achieve the same doping as in the drift zones 6 of the cell field 4.

In the region of the active cell field 4, in case of avalanche the electrical field in the p-doping may have less ripple above the generation region for charge carriers because in compensation regions the generated holes are diverted via the prevailing transverse field into the p-regions and then discharged to source. Here it is very favorable in terms of production technology that the n-doping at the edge may be separated off by a mask because this mask may also be used simultaneously to screen the n-doping in the p-doped regions. At the same time, this also improves the process window and permits a further reduction in grid pitch.

Below this generation region for charge carriers in case of avalanche, i.e., in the illustrated embodiment beneath the epitaxy layer 22, the electrical field in the n-doped regions in the active cell field 4 of the semiconductor chip may have less ripple since here the generated electrons discharge to drain D and the electron charge influences the electrical field in a manner similar to the hole charge. A further small ripple is achieved here by an n-doped epitaxy which may be compensated for by p-areas in the cell field and in the edge region.

The structure of the illustrated embodiment may be achieved by strip-shaped, predominantly non-overlapping n- and p-compensation areas in the upper active region of the semiconductor body 5. In the lower region, on the other hand, the p-regions in the cell field regions may be configured as column-shaped charge carrier compensation zones since they possess the widest process window in a doped epitaxy layer with respect to doping tolerances, i.e. the maximum acceptable difference between the dopant concentration in the drift zone and the dopant concentration in the charge carrier compensation zone at a given minimum blockability of the semiconductor device. Moreover, in the lower region of the semiconductor chip the epitaxy layers 20 and 21 may be deposited either fully as doped epitaxy layers or as partially doped epitaxy layers into which the remainder of the required n-dosage of the epitaxy layer is inserted by implantation.

In the edge termination region illustrated here it is also possible to provide lateral field plates on the semiconductor body 5 and/or field rings alone or in combination with semi-insulating or electro-active layers instead of a VLD structure 14, although this will typically not achieve such high blockability as the VLD structure 14 illustrated in FIGS. 1 and 2. The VLD structure 14 may in addition be passivated using insulators and/or electro-active layers in order to guarantee better long-term stability of the semiconductor device due to the associated lower sensitivity to external ions. FIGS. 3 to 16 described below explain the use of various charge carrier compensation methods for the edge region 7 and the cell field 4 dependent on the depth of the semiconductor body.

Figure 3:
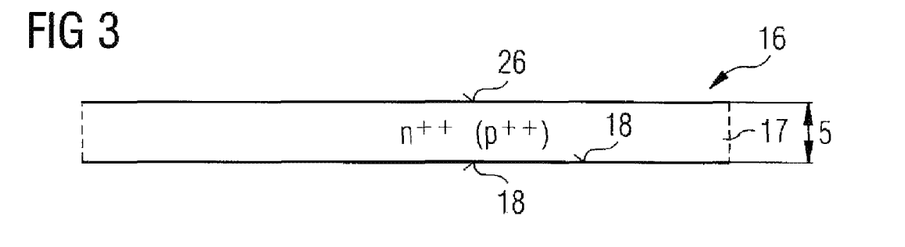
FIG. 3 illustrates a schematic cross-section through a part of a semiconductor wafer.

FIG. 3 illustrates a schematic cross-section through a part of a semiconductor wafer 16. The doping of the semiconductor wafer 16 depends on the semiconductor device to be produced. For MOS field-effect transistors the semiconductor substrate 17 of the semiconductor wafer is $n^{++}$-conducting and thus has high doping of the first type of conductivity such that after completion of the structure of the MOS field-effect transistor with charge carrier compensation zones, the rear side 18 may be provided with a metal layer in order to couple the drain D.

For IGBT devices a $p^{++}$-conducting substrate with a second type of conductivity complementary to the first type is typically used, and following the completion of the IGBT device, the rear side 18 is metalized so that a rear side emitter may be coupled. The upper side 26 of the semiconductor wafer 16 is prepared for the application of a first epitaxy layer which is as free as possible of defects which has the first type of conductivity for both semiconductor device structures, i.e., both the MOS field-effect transistor and the IGBT device, but a concentration lower than or identical to the substrate 17.

For IGBT devices, the substrate may alternatively be completely removed up to the layer 19 in one or more further process steps. In the layer 19 a p-doped area is subsequently inserted and activated. In this case, the $p^{++}$-conducting area 17 is very thin.

Figure 4:
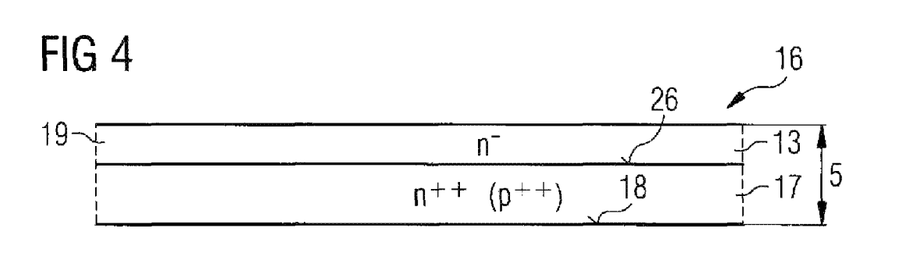
FIG. 4 illustrates a schematic cross-section through the semiconductor wafer illustrated in FIG. 3 with an epitaxy layer applied for a buried field stop zone.

FIG. 4 illustrates a schematic cross-section through the semiconductor wafer 16 illustrated in FIG. 3 with an epitaxy layer 19 applied which in this embodiment is more weakly doped than the substrate 17 and more weakly doped than the subsequent epitaxy layers applied using the multi-epitaxy technique illustrated here. A buried vertical field stop zone 13 may be provided in the device with this epitaxy layer 19. Since the epitaxy layer 19 is provided without charge carrier compensation zones, the actual dopant concentration of the epitaxy layer 19 is typically higher than the dopant concentration of the epitaxial layer 20 and further layers arranged above the epitaxy layer 19, which is the difference between the dopant concentration of the drift zones and the charge carrier compensation zones. Thus, the epitaxy layer 19 may provide a field stop zone despite its lower absolute dopant concentration.

Figure 5:
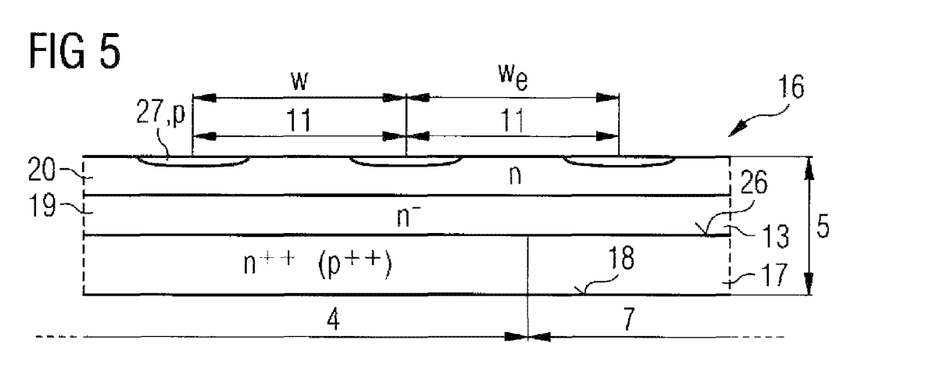
FIG. 5 illustrates a schematic cross-section through a semiconductor wafer as illustrated in FIG. 4 following application of a first epitaxy layer for a charge carrier compensation structure and insertion of first dopant depots.

FIG. 5 illustrates a schematic cross-section through a semiconductor wafer 16 as illustrated in FIG. 4 following application of a first epitaxy layer 20 with a dopant of the first type of conductivity in a concentration corresponding to the drift zone material and higher than the concentration of the field stop zone 13. In FIG. 5, a further process step has already been carried out, namely the insertion of first dopant depots 27 of the complementary second type of conductivity for the material of the charge carrier compensation zones. These dopant depots 27 are positioned both in the cell field 4 and in the edge region 7, in this embodiment the lateral extension w in the cell field 4 and the lateral extension we in the edge region 7 being almost identical.

Here, too, it is also possible to achieve a reduction of the lateral extension We in the edge region 7 in order to improve avalanche strength in the edge region 7, although due to the structure of the edge region an extreme reduction is not necessary since, as has already been described above, dopant depots 27 are to be inserted in the edge region in the lower epitaxy layers only and the compensation methods above the maximum field strength occurring in the semiconductor device are modified as illustrated in FIGS. 8 to 14.

Figure 6:
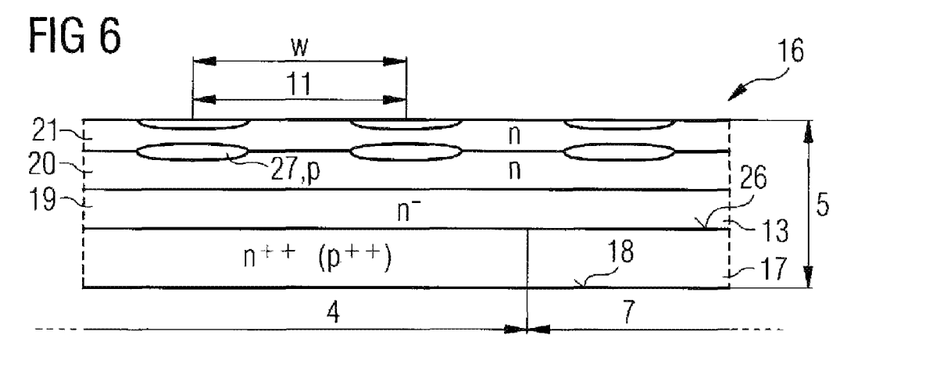
FIG. 6 illustrates a schematic cross-section through the semiconductor wafer illustrated in FIG. 5 following application of a further epitaxy layer and insertion of further dopant depots.

FIG. 6 illustrates a schematic cross-section through the semiconductor wafer 16 illustrated in FIG. 5 following application of a further epitaxy layer 21 with the impurity concentration of the drift zones and insertion of further dopant depots 27 which are lined up with the dopant depots 27 of the first epitaxy layer 20.

Figure 7:
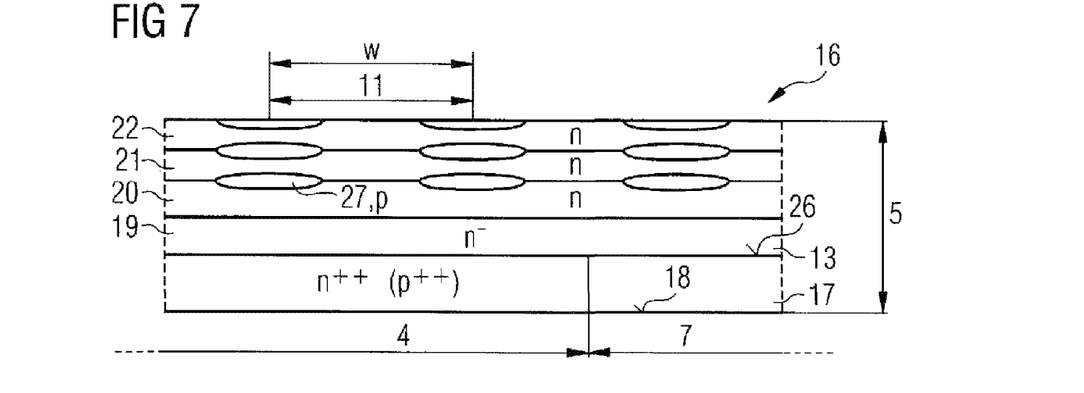
FIG. 7 illustrates a schematic cross-section through the semiconductor wafer illustrated in FIG. 6 following application of a further epitaxy layer and insertion of further dopant depots.

FIG. 7 illustrates a schematic cross-section through the semiconductor wafer 16 illustrated in FIG. 6 following application of a further epitaxy layer 22 which has the same or a similar drift zone dopant concentration as the epitaxy layers 21 and 20. In FIG. 7 further dopant depots 27 of the second complementary type of conductivity have already been inserted into the epitaxy layer 22 where they are positioned above the previously inserted dopant depots 27 in the epitaxy layers 20 and 21.

Figure 8:
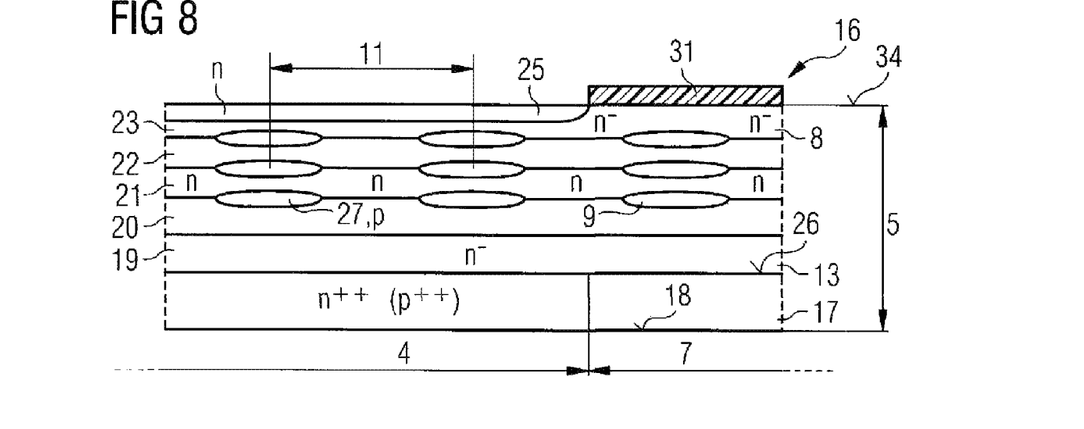
FIG. 8 illustrates a schematic cross-section through the semiconductor wafer illustrated in FIG. 7 following application of an undoped to weakly doped epitaxy layer and application of an edge covering.

FIG. 8 illustrates a schematic cross-section through the semiconductor wafer 16 illustrated in FIG. 7 following application of an undoped or weakly doped epitaxy layer 23 and application of an edge covering 31. An undoped or weakly doped epitaxy layer of this type is produced by not adding any dopants during epitaxy growth. Partial doping is also possible, but at a dopant concentration level far beneath that of the drift zones in the epitaxy layer 23.

Then, as illustrated in FIG. 8, the edge region 7 is provided with a covering layer 31, and impurities which form a large-area dopant depot 25 and are inserted at an ion implantation dosage are implanted in the region of the non-covered cell field 4, thus making it possible to achieve a total dopant concentration for the epitaxy layer 23 equal to the dopant concentration of the drift zones in the cell field 4. This means that due to the covering layer 31, the edge region 7 remains undoped or only weakly doped. These undoped or weakly doped regions are hereinafter referred to as $n^{---}$-conducting.

Figure 9:
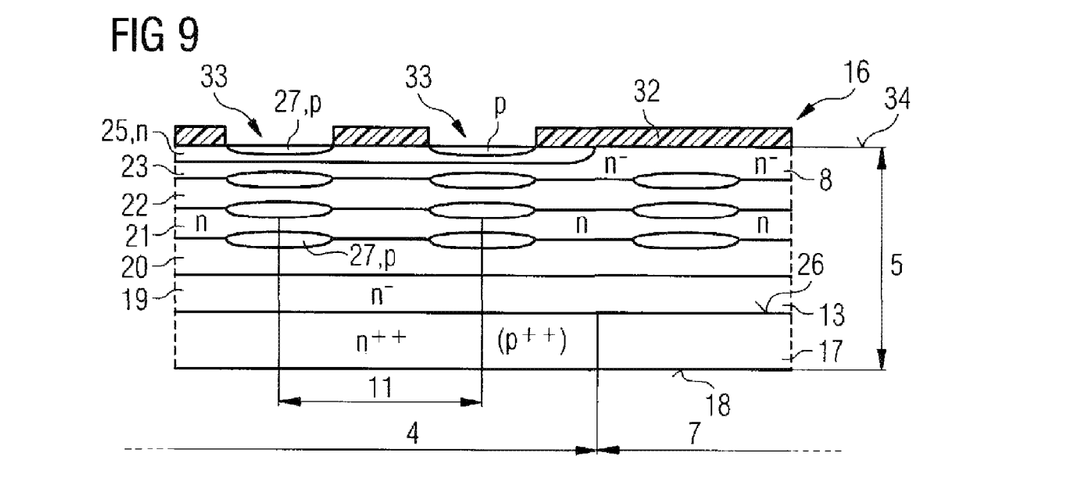
FIG. 9 illustrates a schematic cross-section through the semiconductor wafer illustrated in FIG. 8 following application of a masking layer with windows and insertion of further dopant depots.

FIG. 9 illustrates a schematic cross-section through the semiconductor wafer 16 illustrated in FIG. 8 following application of a masking layer 32 with windows 33 which cover the same area as the dopant depots 27 in the previously applied epitaxy layers 20, 21 and 22. Further dopant depots 27 of the complementary type of conductivity are inserted into the large-area dopant depot 25 of the first type of conductivity via these windows 23.

Figure 10:
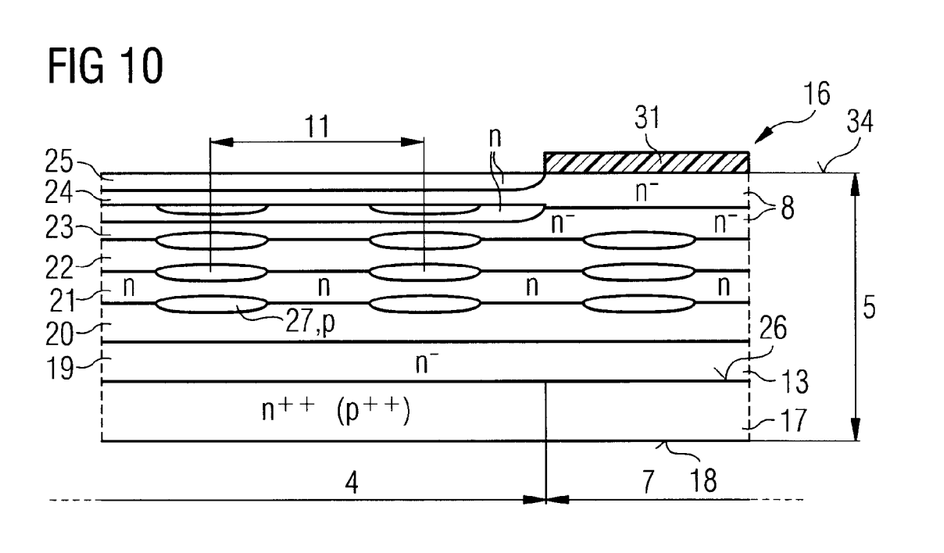
FIG. 10 illustrates a schematic cross-section through the semiconductor wafer illustrated in FIG. 9 following application of an undoped to weakly doped epitaxy layer and covering of an edge region of the epitaxy layer.

FIG. 10 illustrates a schematic cross-section through the semiconductor wafer 16 illustrated in FIG. 9 following application of an undoped or weakly doped epitaxy layer 24 and following covering of the edge region 7 with an edge covering 31. Following this, as illustrated in FIG. 10, it is possible to insert a further large-area dopant depot 25 of the first type of conductivity in the cell region 4 by ion implantation, thereby achieving a total dopant concentration for the epitaxy layer 24 which corresponds to the dopant concentration of the drift zones in the cell field 4.

Figure 11:
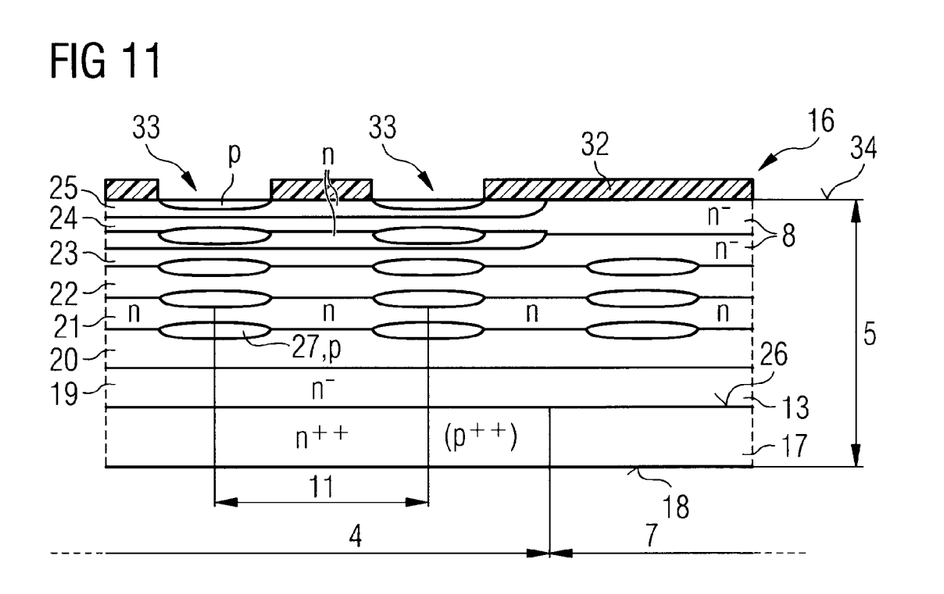
FIG. 11 illustrates a schematic cross-section through the semiconductor wafer illustrated in FIG. 10 following application of a masking layer for the insertion of further dopant depots.

FIG. 11 illustrates a schematic cross-section through the semiconductor wafer 16 illustrated in FIG. 10 following application of a masking layer 32 with windows 33 for inserting further dopant depots 27 of limited area into the epitaxy layer 24 or into the large area dopant depot 25. The windows 33 are once again lined up with the dopant depots 27 previously generated in the epitaxy layers 20, 21, 22 and 23.

Figure 12:
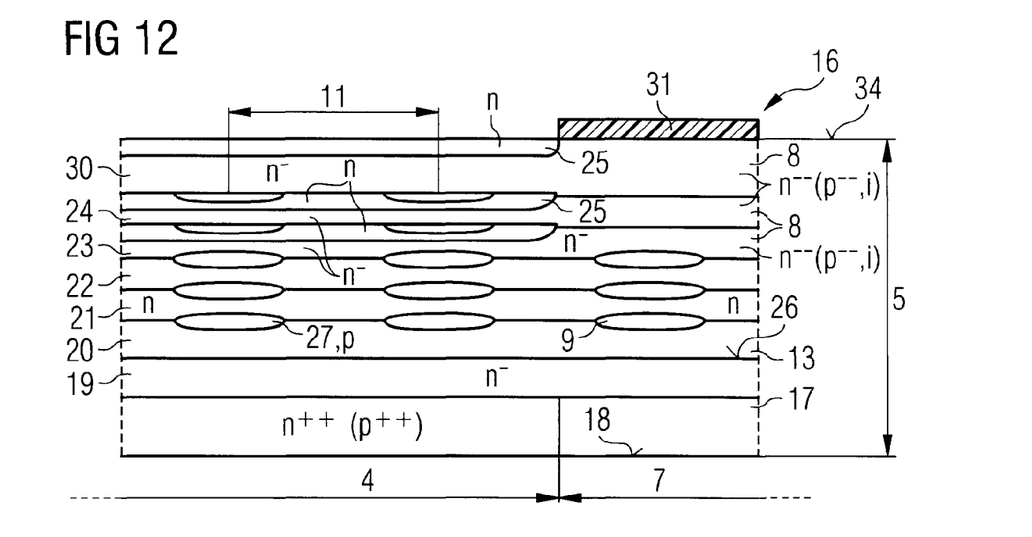
FIG. 12 illustrates a schematic cross-section through the semiconductor wafer illustrated in FIG. 11 following application of an undoped to weakly doped epitaxy layer and following covering of the edge region of the epitaxy layer.

FIG. 12 illustrates a schematic cross-section through the semiconductor wafer illustrated in FIG. 11 following application of an undoped to weakly doped epitaxy layer 30 and covering of the edge region with a covering layer 31. As illustrated in FIG. 12, a further large-area dopant depot 25 of the first type of conductivity is then inserted into the cell field 4 by ion implantation. Now it is possible to apply another structured masking layer, as illustrated in FIG. 13.

Figure 13:
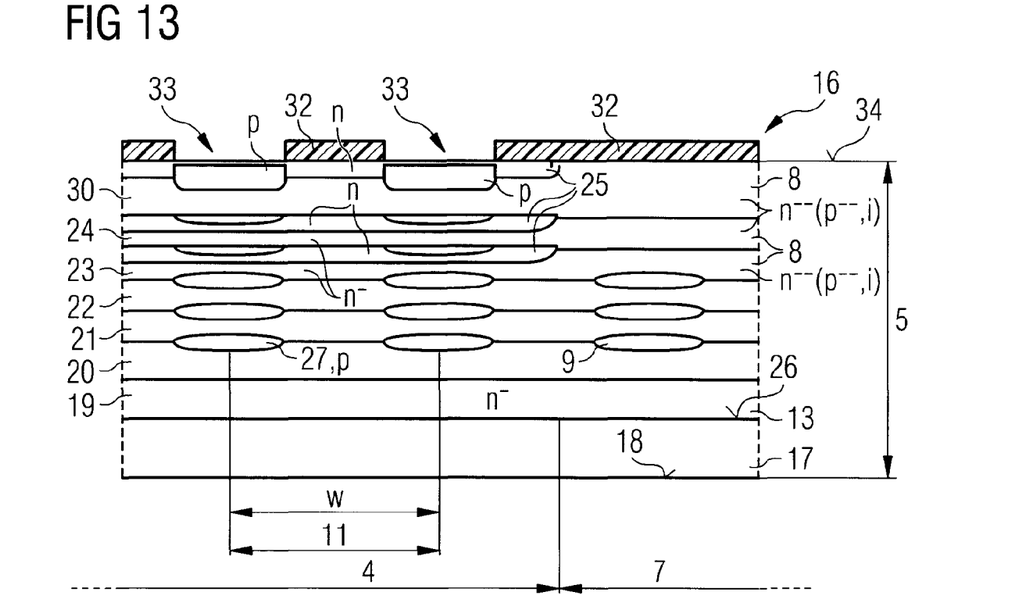
FIG. 13 illustrates a schematic cross-section through the semiconductor wafer illustrated in FIG. 12 following application of a masking layer with windows for the insertion of dopant depots for body zones.

FIG. 13 illustrates a schematic cross-section through the semiconductor wafer 16 illustrated in FIG. 12 following application of a masking layer 32 with windows 33 for dopant depots 27 which in this embodiment are prepared not for charge carrier compensation zones, but for body zones of a MOS field-effect transistor. The epitaxy layer 30 may be provided with a greater thickness and the body zones or the pre-dopant zones for the body zones may be inserted with somewhat higher ion energy. Following removal of the masking layer 32 it is then possible to subject the semiconductor wafer to a diffusion process.

Figure 14:
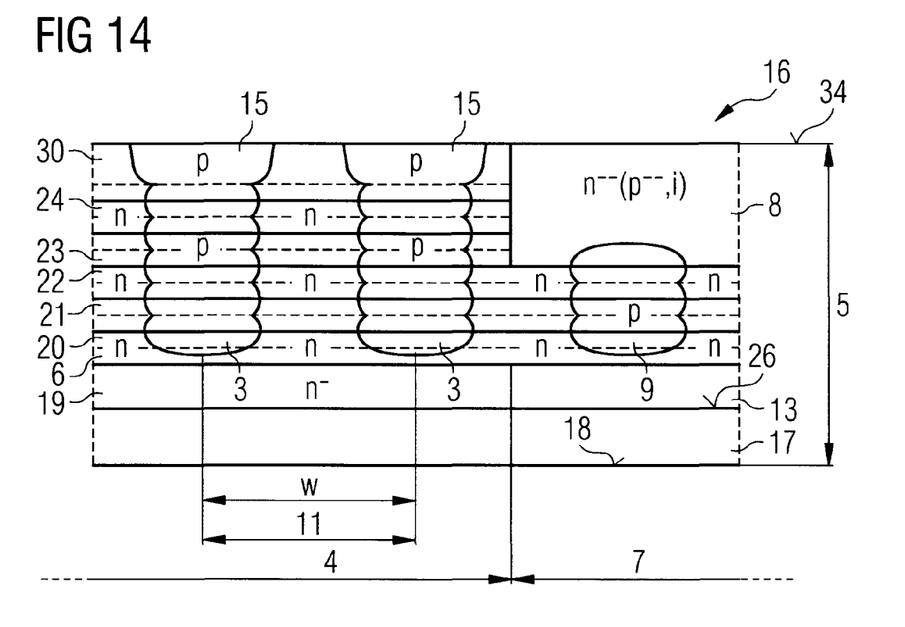
FIG. 14 illustrates a schematic cross-section through the semiconductor wafer illustrated in FIG. 13 following a diffusion process.

FIG. 14 illustrates a schematic cross-section through the semiconductor wafer 16 illustrated in FIG. 13 following a diffusion process. Due to the diffusion process the dopant depots 27 diffuse both vertically and laterally and form connected charge carrier compensation zones 3 in the cell field 4 beneath the body zones 15, while buried, floating charge carrier compensation zones 9 appear in the lower epitaxy layers 20, 21 and 22 in the edge region 7. Due to the covering of the edge region 7 an undoped to weakly doped area 8 forms in the upper epitaxy layers 23, 24 and 30 which guarantees a significantly higher blockability for the edge region than could be achieved previously with the charge carrier compensation zones provided in the edge region which have a smaller grid pitch than the cell field.

With the formation of the body zones it is also possible to create a further improvement in the properties of the semiconductor device in the undoped to weakly doped area 8 by the insertion of a variable lateral dopant structure as illustrated below.

Figure 15:
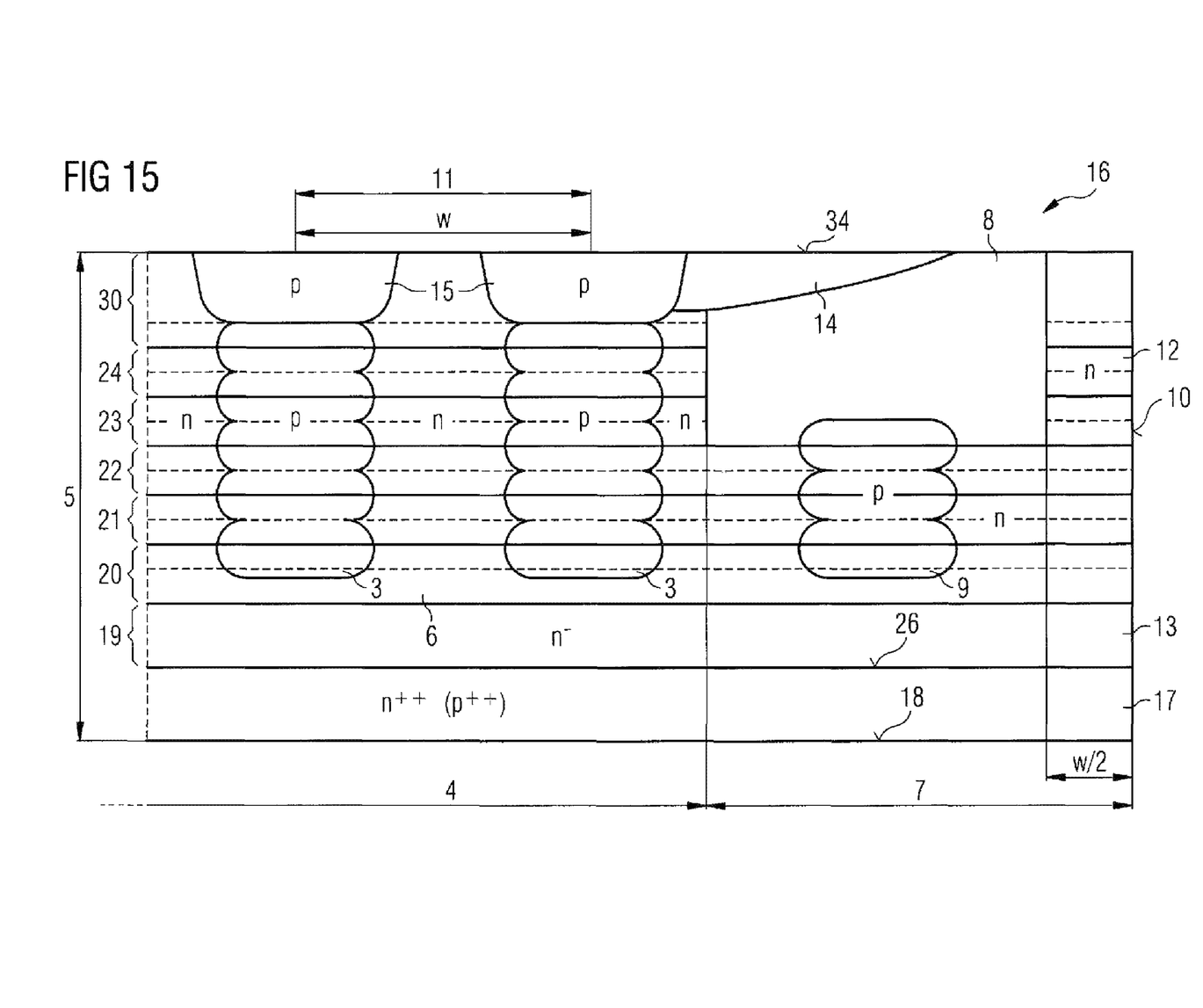
FIG. 15 illustrates a schematic cross-section through the semiconductor wafer illustrated in FIG. 14 following insertion of a VLD structure in the edge region.

FIG. 15 illustrates a schematic cross-section through the semiconductor wafer 16 illustrated in FIG. 14 following insertion of a variable lateral dopant structure 14 in the edge region 7 of the semiconductor device. The properties of a VLD structure of this type have already been discussed above and do not need to be revisited here. The impurities in this VLD structure may be inserted with the ion implantation of the impurities of the body zones 15 if the front-sided surface 34 of the semiconductor body 5 is prepared accordingly.

A further difference to FIG. 14 may be seen in the outermost edge region illustrated in FIG. 15 where the edge covering towards the semiconductor chip edge 10 illustrated in FIGS. 8, 10 and 12 has not covered a narrow region of the epitaxy layers 23, 24 and 30. As a result, a vertical field stop zone 12 with an impurity concentration equal to that of the drift zones 6 forms here. This vertical field stop zone 12 may have a width of at least 0.5·w, i.e., half the cell field grid pitch 11.

Figure 16:
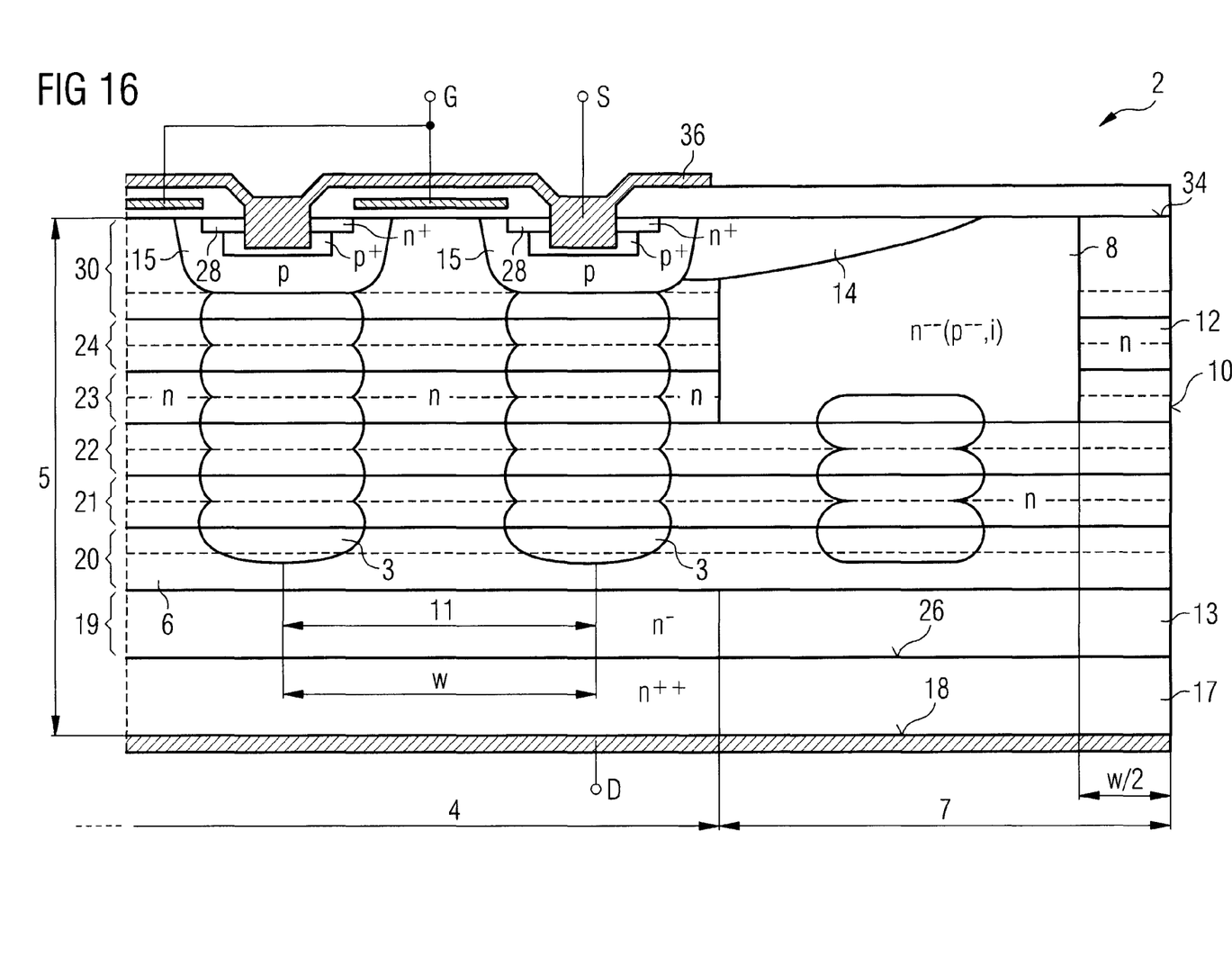
FIG. 16 illustrates a schematic cross-section through the semiconductor wafer illustrated in FIG. 15 following completion of a semiconductor device in a semiconductor chip position of the semiconductor wafer.

FIG. 16 illustrates a schematic cross-section through the semiconductor wafer 16 illustrated in FIG. 15 following completion of a semiconductor device 2 with a chip edge 10 which is produced by dividing the semiconductor wafer 16 into individual semiconductor chips. The design and structure of the semiconductor device illustrated in FIG. 16 is like that illustrated in FIG. 2 and represents the details of the semiconductor device 2.

The process steps required to achieve this structure are firstly the structuring of the front-sided surface 34 of the semiconductor body 5 with an increased dopant concentration of the second type of conductivity inserted into the body zone 15 such that this zone becomes $p^+$-conducting within the body zone 15. Secondly, a source zone 28 is produced by ion implantation within the body zone 15 on the front-sided surface 34 of the semiconductor body which is $n^+$-conducting and which is coupled following the production of a, for example, lateral gate structure 29 by using a source metallization 36.

Finally, the semiconductor wafer may be thinned and a large area of the rear side 18 may be coated with a drain metallization 35 before the semiconductor wafer is divided into individual semiconductor chips.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device with a charge carrier compensation structure in a semiconductor body comprising:
   a cell field with drift zones of a first type of conductivity and charge carrier compensation zones of a type of conductivity complementary to the first type of conductivity;
   an edge region which surrounds the cell field; and
   wherein the edge region includes a near-surface area being undoped to more weakly doped than the drift zones, wherein beneath the near-surface area at least one buried, vertically extending, complementarily doped zone is positioned, and wherein an epitaxy layer forming a lateral buried field stop zone is positioned on an upper side of a substrate, wherein the buried field stop zone has an $n^-$-conducting type of dopant concentration which is lower than the dopant concentration of subsequent epitaxy layers of the drift zones and lower than the dopant concentration of the substrate, wherein a lateral field stop zone running upwards along a semiconductor chip edge from the buried field stop zone to a front-sided surface of the semiconductor body includes a dopant concentration of the drift zones, wherein the near surface area extends in a distance between the upwards running field stop zone and the cell field, and wherein a Variable Lateral Dopant structure (VLD structure) is arranged in a transitional region from the cell field into the edge region.

2. The semiconductor device of claim 1, wherein the near-surface area contacts the field stop zone.

3. The semiconductor device of claim 1, wherein a lateral grid pitch of the at least one buried, vertically extending, complementarily doped zone in the edge region is smaller than a stepwidth of the charge carrier compensation zones in the cell field.

4. The semiconductor device of claim 1, wherein the field stop zone includes a lateral extension towards the semiconductor chip edge of at least a half grid pitch of the cell field.

5. A semiconductor device with a charge carrier compensation structure in a semiconductor body comprising:
   a cell field with drift zones of a first type of conductivity and charge carrier compensation zones of a type of conductivity complementary to the first type of conductivity;
   an edge region which surrounds the cell field; and
   wherein the edge region includes a near-surface area being undoped to more weakly doped than the drift zones, wherein beneath the near-surface area at least one buried, vertically extending, complementarily doped zone is positioned, and wherein a buried field stop zone vertically adjoins the drift zones in the semiconductor body, the buried field stop zone being more weakly doped than the drift zones in the same type of conductivity, and wherein a lateral field stop zone running upwards along a semiconductor chip edge from the buried field stop zone to a front-sided surface of the semiconductor body includes a dopant concentration of the drift zones.

6. A semiconductor device with a charge carrier compensation structure in a semiconductor body comprising:
   a cell field with drift zones of a first type of conductivity and charge carrier compensation zones of a type of conductivity complementary to the first type of conductivity;
   an edge region which surrounds the cell field; and
   wherein the edge region includes a near-surface area being undoped to more weakly doped than the drift zones, wherein beneath the near-surface area at least one buried, vertically extending, complementarily doped zone is positioned, and wherein a Variable Lateral Dopant structure (VLD structure) is arranged in a transitional region from the cell field to the edge region, and wherein a lateral field stop zone running upwards along a semiconductor chip edge from a buried field stop zone to a front-sided surface of the semiconductor body includes a dopant concentration of the drift zones.

7. The semiconductor device of claim 6, wherein the variable lateral dopant structure includes a complementary type of conductivity.

8. The semiconductor device of claim 6, wherein the variable lateral dopant structure includes a higher dopant dose towards the cell field than towards the edge region.

9. The semiconductor device of claim 6, wherein the variable lateral dopant structure towards the cell field projects into body zones of the cell field.

10. The semiconductor device of claim 6, wherein at least in parts of the VLD structure a depletion region extends up to the front-sided surface of the semiconductor body when the semiconductor device is reverse-biased.

* * * * *